(12) United States Patent
Bu

(10) Patent No.: US 7,646,638 B1
(45) Date of Patent: Jan. 12, 2010

(54) NON-VOLATILE MEMORY CELL THAT INHIBITS OVER-ERASURE AND RELATED METHOD AND MEMORY ARRAY

(75) Inventor: Jiankang Bu, Windham, ME (US)

(73) Assignee: National Semiconductor Corporation, Santa Clara, CA (US)

(*) Notice: Subject to any disclaimer, the term of this patent is extended or adjusted under 35 U.S.C. 154(b) by 19 days.

(21) Appl. No.: 11/899,462

(22) Filed: Sep. 6, 2007

(51) Int. Cl.
*G11C 11/34* (2006.01)

(52) U.S. Cl. ............... 365/185.05; 365/185.18; 365/185.29; 365/185.3; 365/185.33

(58) Field of Classification Search ............ 365/185.1, 365/185.18, 185.26, 185.27, 185.28, 185.29, 365/185.3, 185.33, 185.01, 185.05, 185.14, 365/185.15, 185.24, 185.25
See application file for complete search history.

(56) References Cited

U.S. PATENT DOCUMENTS

| | | | | |
|---|---|---|---|---|
| 4,885,719 | A * | 12/1989 | Brahmbhatt | 365/185.29 |
| 4,888,738 | A * | 12/1989 | Wong et al. | 365/185.3 |
| 5,272,368 | A * | 12/1993 | Turner et al. | 365/185.1 |
| 5,615,150 | A * | 3/1997 | Lin et al. | 365/185.29 |
| 5,963,480 | A * | 10/1999 | Harari | 365/185.29 |
| 6,191,980 | B1 * | 2/2001 | Kelley et al. | 365/185.29 |
| 6,385,090 | B1 | 5/2002 | Kitazaki | |
| 6,711,062 | B1 * | 3/2004 | Chou | 365/185.29 |
| 6,853,583 | B2 | 2/2005 | Diorio et al. | |
| 6,985,386 | B1 * | 1/2006 | Mirgorodski et al. | 365/185.05 |
| 7,447,064 | B1 * | 11/2008 | Bu et al. | 365/185.18 |
| 7,471,572 | B1 * | 12/2008 | Bu | 365/185.29 |
| 7,474,568 | B2 * | 1/2009 | Horch | 365/185.29 |
| 7,483,310 | B1 * | 1/2009 | Bu | 365/185.05 |
| 7,508,719 | B2 * | 3/2009 | Horch | 365/185.29 |

OTHER PUBLICATIONS

Jiankang Bu et al., "System and Method for Providing Drain Avalanche Hot Carrier Programming for Non-Volatile Memory Applications", U.S. Appl. No. 11/509,790, filed Aug. 24, 2006.

* cited by examiner

*Primary Examiner*—Trong Phan

(57) ABSTRACT

A memory cell includes a first transistor and a second transistor. The first transistor is configured as an erase capacitor, and the second transistor is configured as a program transistor. Gates of the first and second transistors are coupled together to form a floating gate. During an erase operation, a first voltage (like 12V-24V) is applied to the first transistor, such as to a source, a body, and a drain of the first transistor. A second voltage (like ground) is applied to the second transistor, such as to a source and a body of the second transistor. A drain of the second transistor could be grounded. The first and second voltages cause electron discharge from the floating gate through the first transistor and electron injection through the second transistor onto the floating gate. This helps to prevent an over-erase condition from forming in the memory cell.

20 Claims, 3 Drawing Sheets

NON-VOLATILE MEMORY CELL THAT INHIBITS OVER-ERASURE AND RELATED METHOD AND MEMORY ARRAY

TECHNICAL FIELD

This disclosure is generally directed to memory cells and more specifically to a non-volatile memory cell that inhibits over-erasure and related method and memory array.

BACKGROUND

Conventional non-volatile memory (NVM) cells are routinely used in electronic circuitry, such as electronic consumer devices. A typical non-volatile memory cell often includes multiple transistors with a floating gate. A charge stored on the floating gate typically represents the logical value stored in the non-volatile memory cell.

Conventional non-volatile memory cells often suffer from a problem known as over-erasure. Over-erasure occurs when the floating gate of a non-volatile memory cell is positively charged during an erasure of the non-volatile memory cell. This positive charge could prevent subsequent programming of the non-volatile memory cell. This positive charge could also allow only a weak subsequent programming of the non-volatile memory cell, meaning the non-volatile memory cell provides a less-than-expected current after programming (which makes it more difficult to determine the programming state of the memory cell). Either of these problems may lead to a program failure of the non-volatile memory cell.

While various techniques have been developed to combat over-erasure, production irregularities associated with the non-volatile memory cells make it difficult to define a uniform erase procedure. One example production irregularity is the variations in charges held by the floating gates in non-volatile memory cells after fabrication. Other example production irregularities include variations in the transistor threshold voltages, gate oxide thicknesses, and doping concentrations in the non-volatile memory cells.

Solutions have been proposed to inhibit over-erasure while considering such production irregularities. However, these solutions typically require additional components, which increase the cost of the memory cells. These solutions also often optimize each individual memory cell's erase condition, which typically makes the erase time too long for use with large-scale memory cell arrays. In addition, these solutions often do not work when attempting to erase an entire memory cell array or when attempting to erase a memory cell array block-by-block because the memory state distribution (how many cells are in the "0" state and how many cells are in the "1" state) is unpredictable before the erase operation.

Another technique for combating over-erasure involves applying a larger programming voltage to the source of a program transistor in a non-volatile memory cell. A particular example could involve a 40% increase over a normal programming voltage, such as 7V compared to a 5V normal programming voltage. However, this results in higher power consumption by the non-volatile memory cell. This technique is also not immune to production irregularities associated with the non-volatile memory cells.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 5, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
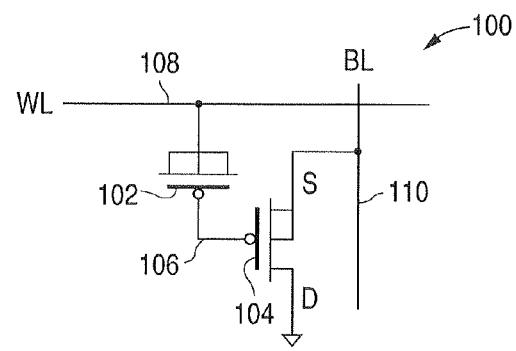
FIG. 1 illustrates an example non-volatile memory cell according to this disclosure.

FIG. 1 illustrates an example non-volatile memory cell 100 according to this disclosure. The embodiment of the memory cell 100 shown in FIG. 1 is for illustration only. Other embodiments of the memory cell 100 could be used without departing from the scope of this disclosure.

In this example, the memory cell 100 includes two transistors 102 and 104 having a floating gate 106, a write line (WL) 108, and a bit line (BL) 110. As shown here, the transistor 102 has a source, body, and drain coupled to the write line 108. The transistor 104 has a source and body coupled to the bit line 110 and a drain coupled to ground. The gates of the transistors 102 and 104 are coupled together to form the floating gate 106. The floating gate 106 is "floating" since it is not coupled to any known potential.

The transistors 102 and 104 in this example represent p-channel metal oxide semiconductor (PMOS) transistors. When coupled as shown in FIG. 1, the transistor 102 acts as an erase capacitor, and the transistor 104 acts as a program transistor. The program transistor is used to program a value into the memory cell 100, such as by injecting electrons onto the floating gate 106 during a program operation. The erase capacitor is used to erase a value from the memory cell 100, such as by removing electrons from the floating gate 106 during an erase operation.

The write line 108 represents a wire, trace, or other electrically conductive line that is coupled to the source, body, and drain of the transistor 102 and is capable of conducting a voltage or current signal. Similarly, the bit line 110 represents a wire, trace, or other electrically conductive line that is coupled to the source and body of the transistor 104 and is capable of conducting a voltage or current signal.

During a program operation for the memory cell 100, a program bias can be applied to the write line 108 (such as a 6V signal), and a program bias can be applied to the bit line 110 (such as a 5V signal). This causes electrons to be injected onto the floating gate 106 through the transistor 104. Typically, the memory cell 100 is "programmed" to have a first logical state (such as a logical "1" state), and the memory cell 100 remains unprogrammed to have a second logical state (such as a logical "0" state). These logical states are associated with different amounts of electrons stored on the floating gate 106 of the memory cell 100.

During a read operation for the memory cell 100, a read bias can be applied to the bit line 110 (such as a 3.3V signal), and the write line 108 can be grounded. This typically results in a current through the memory cell 100 that varies based on whether the memory cell 100 has been programmed. As a particular example, a current associated with a programmed memory cell could be at least 50 µA or more, while a current associated with an unprogrammed (or erased) memory cell could be no more than 5 µA. The specific amount of current from the memory cell 100 allows an external component to read the state of the memory cell 100.

As noted above, conventional non-volatile memory cells often suffer from over-erasure, which may occur when the floating gate of the non-volatile memory cell is positively charged during an erase operation. Using the memory cell 100 of FIG. 1 as an example, over-erasure could occur when the floating gate 106 develops a positive charge (due to the flow of electrons out of the floating gate 106 through the transistor 102 during an erase operation). If this positive charge is larger than the voltage applied to the bit line 110 during a subsequent program operation, the memory cell 100 cannot be programmed correctly. If this positive charge is close to the voltage applied to the bit line 110 during the subsequent program operation, the memory cell 100 could be weakly charged, meaning an inadequate amount of electrons may be injected onto the floating gate 106 during the subsequent program operation. This may lead, for example, to a current of 10 µA during a subsequent read operation, which is far below the required 50 µA current. This could also lead to a current of less than 5 µA during a subsequent read operation, which could cause an external component to improperly read the memory cell 100 as being unprogrammed. Once in an over-erase state, a memory cell is typically not able to get out of the over-erase state, which could render the memory cell useless.

In accordance with this disclosure, over-erasure is reduced or eliminated by performing a saturating erase operation for the memory cell 100. During a saturating erase operation, an erase voltage applied to the write line 108 is at a level that is even higher than a level that could cause over-erasure. For example, during a saturating erase operation, a 24V signal could be applied to the write line 108, and the bit line 110 could be grounded. At this elevated erase voltage, tunneling current from a substrate of the memory cell 100 through the transistor 104 to the floating gate 106 becomes significant. This tunneling current helps to compensate for erase tunneling current from the floating gate 106 through the transistor 102 to the substrate. This helps to prevent the potential of the floating gate 106 from being charged up higher and higher, which eventually leads to the over-erase state.

Although FIG. 1 illustrates one example of a non-volatile memory cell 100, various changes may be made to FIG. 1. For example, the layout and arrangement of the transistors 102 and 104, the floating gate 106, and the signal lines 108-110 are for illustration only. Also, other or additional components could be used in the memory cell 100.

Figure 2A:
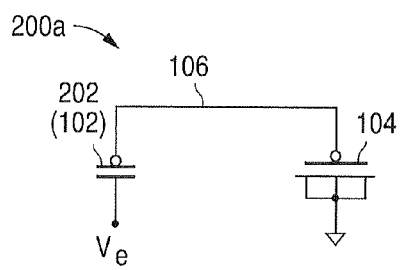
FIGS. 2A and 2B illustrate example equivalent circuits of a non-volatile memory cell according to this disclosure.
Figure 2B:
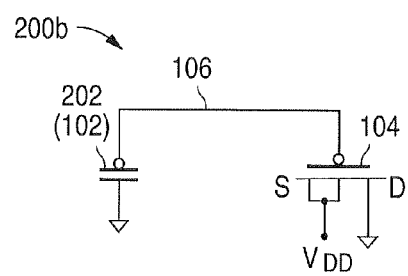

FIGS. 2A and 2B illustrate example equivalent circuits 200a and 200b of a non-volatile memory cell according to this disclosure. For example, FIG. 2A could represent the equivalent circuit 200a of the non-volatile memory cell 100 during an erase operation, and FIG. 2B could represent the equivalent circuit 200b of the non-volatile memory cell 100 during a program operation. The equivalent circuits 200a and 200b shown in FIGS. 2A and 2B are described with respect to the non-volatile memory cell 100 of FIG. 1. The equivalent circuits 200a and 200b could be associated with any other suitable memory cell.

During a normal (non-saturating) erase operation, the transistor 102 functions as an erase capacitor 202, and an electric field across the erase capacitor 202 causes an electron discharge from the floating gate 106 through the erase capacitor 202 to the substrate of the memory cell 100. When the erase operation completes, the final potential of the floating gate 106 (denoted $V_{FG\_erased}$) can be determined using the difference between the amount of electrons discharged in the erase operation (denoted $Q_{E\_erased}$) and the amount of electrons injected onto the floating gate 106 in a previous program operation (denoted $Q_{E\_injected}$). This can be quantified as:

$$V_{FG\_erased} = \frac{Q_{E\_erased} - Q_{E\_injected}}{C_e + C_p} \quad (1)$$

where $C_e$ represents the capacitance of the erase capacitor 202 (the transistor 102) and $C_p$ represents the capacitance of the program transistor 104. During the next program operation, the potential of the floating gate 106 (denoted $V_{FG\_write}$) can be expressed as:

$$V_{FG\_write} = V_{DD} \frac{C_p}{C_e + C_p} + V_{FG\_erased} \quad (2)$$

where $V_{DD}$ represents the charge applied to the source and body of the transistor 104 via the bit line 110 during programming. However, if ($V_{FG\_write}$-$V_{DD}$) is greater than the threshold voltage of the transistors 102 and 104 (denoted $V_{TH}$), there may be no hot electron injection onto the floating gate 106 during the program operation, resulting in a program failure. This program failure is caused by an inappropriate erase operation that leads to an excessively high $V_{FG\_erased}$ value (over-erasure).

In accordance with this disclosure, a saturating erase operation is used to inhibit the creation of over-erase conditions in the memory cell 100. If the electric field across the erase capacitor 202 (the transistor 102) goes higher than the electric field that normally leads to over-erasure, the tunneling current across the program transistor 104 onto the floating gate 106 can be significant. This tunneling current leads to electron injection onto the floating gate 106 during the saturating erase operation.

While the saturating erase operation may allow some of the electrons on the floating gate 106 to discharge through the capacitor 202, eventually the electron discharge through the capacitor 202 equals the electron injection through the transistor 104 (meaning further erasure cannot occur). In other words, the memory cell 100 operates by allowing excessive discharge of electrons through the capacitor 202, which would normally lead to over-erasure. However, the memory cell 100 compensates by allowing electron injection through the program transistor 104 during the erase operation. This helps to prevent the floating gate 106 from obtaining an excessively large positive potential during the saturating erase operation, thereby avoiding the over-erase condition.

As a particular example, if the electric field across the capacitor 202 is larger than 6.7 MV/cm, the tunneling current across the transistor 104 can be significant and help to avoid over-erasure. For a program transistor 104 with a 120 Å gate oxide, significant tunneling can be activated if the program transistor 104 has a gate-to-body voltage ($V_{GB}$) of 8V during the erase operation. For a 2:1 $C_p$:$C_e$ ratio, if the erase voltage (denoted $V_e$) applied to the capacitor 202 (transistor 102) on the write line 108 is 24V and the bit line 110 is grounded, 8V can be coupled to the program transistor 104, and the saturating erase operation can be activated.

An analytical model can be used to determine the proper erase voltage $V_e$ to be applied during a saturating erase operation. In some embodiments, the selected erase voltage may satisfy three conditions. First, the erase voltage may be high enough to activate the tunneling current from the substrate of the memory cell 100 through the program transistor 104 to the floating gate 106. Second, the erase voltage may be high enough to lower the potential of the floating gate 106 to a level that does not cause over-erase failure. Third, the erase voltage may be low enough to reduce or prevent serious oxide damage to the memory cell 100.

The proper erase voltage for the memory cell 100 could be found in any suitable manner, such as experimentally or through simulation. As a particular example, the erase voltage $V_e$ (which is applied to the capacitor 202/transistor 102 via the write line 108) could satisfy the equation:

$$V_e > \frac{C_e + C_p}{C_e}(Eoxp \times Tox - V_{TH}) - V_{DD}. \quad (3)$$

Here, Tox represents the gate oxide thickness of the transistor 104, and Eoxp represents the electric field across the gate oxide of the program transistor 104 during the saturating erase operation. The value of Eoxp could be selected so that the discharge current through the capacitor 202 equals the injection current through the transistor 104 during the saturating erase operation. The value of Eoxp can be determined by solving the following equations:

$$C_p \times Eoxp^2 \times \exp\left(-\frac{B}{Eoxp}\right) = \frac{C_e}{C_p} \times Eoxe^2 \times \exp\left(-\frac{B}{Eoxe}\right) \quad (4)$$

$$Eoxe = \frac{V_e}{Tox} - Eoxp. \quad (5)$$

Here, Eoxe represents the electric field across the gate oxide of the capacitor 202 during the saturating erase operation, and B represents a physical constant that is determined by an electron effective mass in an oxide and a silicon-silicon dioxide potential barrier height in the circuit. The saturation is determined by the final electric field. In general, the uniformity of the memory state increases with longer erase times. Example erase times at the saturating erase voltage could be from 100 ms up to and including 3000 ms, although any suitable erase time(s) could be used.

Although FIGS. 2A and 2B illustrate examples of equivalent circuits 200a and 200b of a non-volatile memory cell, various changes may be made to FIGS. 2A and 2B. For example, the equivalent circuits 200a and 200b could have any other or additional components according to particular implementations of the non-volatile memory cell.

Figure 3:
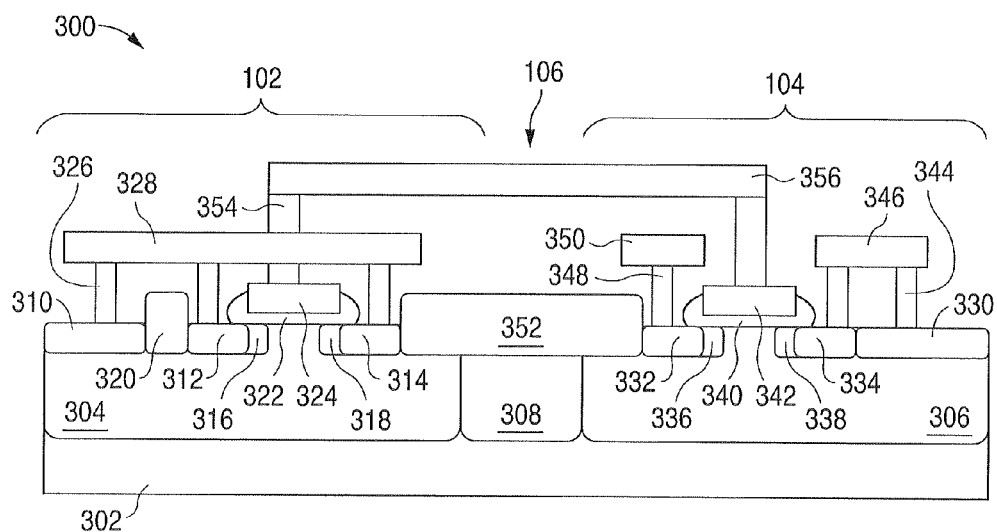
FIG. 3 illustrates an example cross-section of a non-volatile memory cell according to this disclosure.

FIG. 3 illustrates an example cross-section 300 of a non-volatile memory cell according to this disclosure. The cross-section 300 shown in FIG. 3 is described with respect to the non-volatile memory cell 100 of FIG. 1. The memory cell 100 could have any other suitable cross-section.

As shown here, the memory cell 100 is formed over a semiconductor substrate 302. The substrate 302 could represent any suitable type of substrate, such as a p-type silicon or other substrate.

Two n-wells 304 and 306 are formed in the substrate 302 and are separated by a p-well 308. Each of the n-wells 304 and 306 represents any suitable portion of the substrate 302 that has been doped with an n-type dopant. The p-well 308 represents any suitable portion of the substrate 302 that has been doped with a p-type dopant.

The transistor 102 (erase capacitor 202) is formed in and over the n-well 304. For example, the transistor 102 includes an n-type doped region 310, such as an N+ doped region and/or an n-type lightly doped drain (NLDD) region. The transistor 102 also includes four p-type doped regions 312-318. The doped regions 312-314 could represent P+ doped regions, and the doped regions 316-318 could represent p-type lightly doped drain (PLDD) regions. An oxide region 320 separates the doped regions 310 and 312, and an oxide region 322 separates the substrate 302 from a conductive gate contact 324. The gate contact 324 could, for example, be formed from polysilicon. Conductive interconnects 326 couple the doped regions 310-314 to a conductive source/body/drain contact 328, which could be coupled to the write line 108. The interconnects 326 and contact 328 could, for example, be formed from polysilicon.

The program transistor (transistor 104) is formed in and over the n-well 306. For example, the transistor 104 includes an n-type doped region 330, such as an N+ doped region and/or an NLDD region. The transistor 104 also includes four p-type doped regions 332-338. The doped regions 332-334 could represent P+ doped regions, and the doped regions 336-338 could represent PLDD regions. An oxide region 340 separates the substrate 302 from a conductive gate contact 342, which could be formed from polysilicon. Conductive interconnects 344 couple the doped regions and 334 to a conductive source/body contact 346, which could be coupled to the bit line 110. A conductive interconnect 348 couples the doped region 332 to a conductive drain contact 350, which could be grounded. The interconnects 344 and 348 and contacts 346 and could, for example, be formed from polysilicon.

An oxide region 352 separates the transistors 102 and 104. Also, conductive interconnects 354 couple the gate contacts and 342 to a conductive layer 356, thereby forming the floating gate 106. The interconnects 354 and conductive layer 356 could, for example, be formed from polysilicon.

In this example embodiment, during an erase operation, an erase voltage can be applied to the source/body/drain contact 328 of the transistor 102, such as a 12V or 24V signal applied via the write line 108. Also, the drain contact 350 of the transistor 104 can be grounded, and the source/body contact 346 of the transistor 104 can also be grounded via the bit line 110. This may cause tunneling current to flow from the substrate 302 through the transistor 104 onto the floating gate 106 during the erase operation, which can help to avoid the creation of over-erase conditions in the memory cell 100.

The various structures shown in FIG. 3 could be formed in any suitable manner using any suitable technique. For example, the various doped regions could be formed by masking the appropriate regions of the substrate 302 and performing the appropriate implantations. Also, the various oxide regions could be formed by masking the appropriate regions of the substrate 302 and oxidizing the exposed portions of the substrate 302 or by depositing an oxide or other material on the substrate 302. Further, the various contacts and conductive layers could be formed by depositing a layer of conductive material(s) and etching the layer. In addition, the various interconnects could be formed by depositing a layer of oxide or other material(s), etching trenches or vias in the oxide or other layer, and depositing polysilicon or other conductive material(s) in the etched trenches or vias. Although not shown, one or more oxide or other layers could surround or encapsulate the various structures above the substrate 302 in FIG. 3.

Although FIG. 3 illustrates one example of a cross-section 300 of a non-volatile memory cell, various changes may be made to FIG. 3. For example, the non-volatile memory cell 100 could have any other suitable cross-section.

Figure 4:
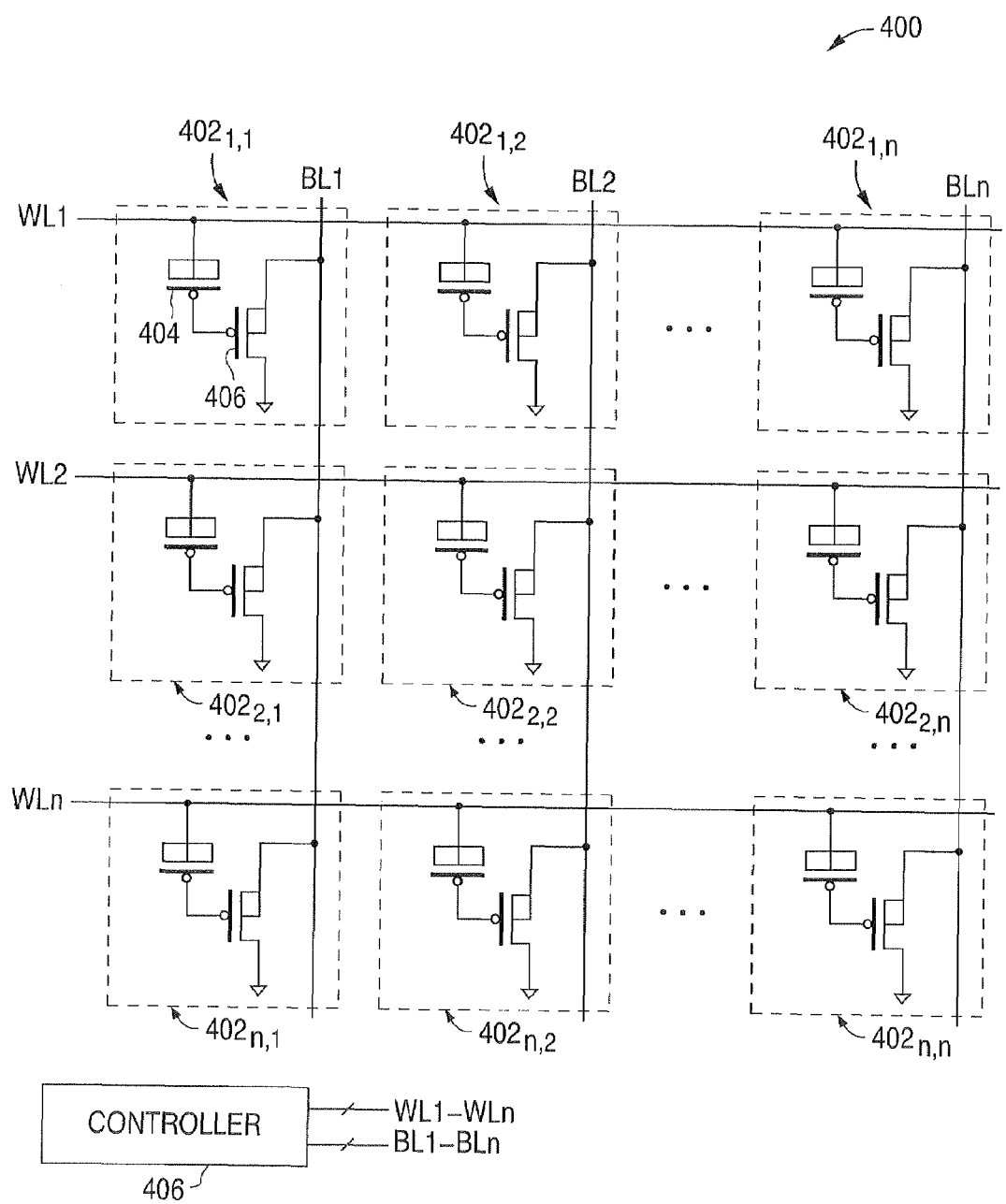
FIG. 4 illustrates an example non-volatile memory cell array according to this disclosure.

FIG. 4 illustrates an example non-volatile memory cell array 400 according to this disclosure. The embodiment of the memory cell array 400 shown in FIG. 4 is for illustration only. Other embodiments of the memory cell array 400 could be used without departing from the scope of this disclosure.

In this example, the memory cell array 400 is formed from various memory cells $402_{1,1}$-$402_{1,n}$, $402_{2,1}$-$402_{2,n}$, ... $402_{n,1}$-$402_{n,n}$. At least some of the memory cells may be the same as or similar to the memory cell 100 shown in FIG. 1. For example, each memory cell could include a transistor 404 acting as an erase capacitor and a transistor 406 acting as a program transistor. Each memory cell is coupled to one of multiple write lines (WL1-WLn) and to one of multiple bit lines (BL1-BLn). Each transistor 404 has its source, body, and drain coupled to one of the write lines. Each transistor 406 has its source and body coupled to one of the bit lines and its drain grounded. The transistors 404-406 have their gates coupled together to form a floating gate.

In this arrangement, a memory cell in the array 400 can be erased, programmed, or read by applying a suitable voltage to its write line and/or a suitable voltage to its bit line. Examples of the various signals that can be applied to the various write and bit lines during operation of the memory cell array 400 are shown in Table 1. Table 1 assumes that the transistors 404-406 have a gate oxide thickness of 70 Å and that the memory cells are block-erased by row.

TABLE 1

|  | Selected WL | Selected BL | Unselected WL | Unselected BL |
|---|---|---|---|---|
| Program | $V_{Prog\_WL}$ | $V_{Prog\_BL}$ | 0 | 0 |
| Erase | $V_{Erase}$ | 0 | $V_{Erase}$ | 0 |
| Read | 0 | $V_{Read}$ | 0 | 0 |

Here, $V_{Prog\_WL}$ may equal or approximately equal 6V, $V_{Prog\_BL}$ may equal or approximately equal 5V, $V_{Erase}$ may equal or approximately equal 12V, and $V_{Read}$ may equal or approximately equal 3.3V. These values, such as the $V_{Erase}$ value, may vary depending on the implementation of the memory cells in the array 400.

As shown in FIG. 4, the memory array 400 also includes or is coupled to a controller 406. The controller 406 represents any suitable structure for controlling the operation of the memory cells in the array 400. In this example, the controller 406 is coupled to the write lines and bit lines of the array 400 and provides suitable control signals to the lines. This enables the controller 406 to control the erasure, programming, and reading of the memory cells in the array 400.

In some embodiments where a large-scale array 400 is implemented, the high erase voltage ($V_{Erase}$ in Table 1 or $V_e$ above) used during a saturating erase operation could lead to a large current spike at the beginning of the erase operation. For example, the erase current for a single memory cell could be approximately 272 µA at the beginning of an erase operation and saturate at 5 pA at the end of the erase operation. This could be normal behavior since, at the beginning of the erase operation, there are electrons stored on the floating gate 106 that increase the erase current. At the end of the erase operation, the floating gate 106 is slightly positively charged, which reduces the erase current. For large-scale memory arrays, this may be problematic if the erase peripheral circuitry cannot handle such large transient currents. As a particular example, for a 10 kB array, the total erase current could be as high as 3 A at the beginning of an erase operation but only 150 µA at the end of the erase operation. Among other things, this could damage the peripheral circuitry and lead to yield loss. One way to avoid this problem is to implement the saturating erase operation by ramping the erase voltage from a lower level to a higher level during the erase operation. For instance, the erase voltage could be ramped from 17V to 24V in 500 ms so as to avoid the erase current fluctuations.

Because activation of the saturating erase can be determined by the final electric field across the transistor 406 in a memory cell in the array 400, the saturating erase operation may have less dependence on what happens during the erase process. For example, if a memory cell goes into an over-erase state before or during the erase operation, the saturating erase operation allows the memory cell to exit out of the over-erase state. Also, this technique may reduce or eliminate sensitivity to production irregularities, as well as sensitivities to pre-erase memory state distribution in a large-scale memory array. For instance, increasing the erase time may eliminate the dependence on the memory state statistics distribution, allowing the same post-erase memory state to be achieved in the array 400 no matter how many memory cells in the array 400 are in the "1" state prior to the erase operation (such as whether that value is 1%, 50%, or 90%).

Although FIG. 4 illustrates one example of a non-volatile memory cell array 400, various changes may be made to FIG. 4. For example, the memory cell array 400 could have any suitable number of memory cells in any suitable arrangement. As a particular example, while shown as an nxn array, the memory cell array 400 could have any other equal or non-equal dimensions.

Figure 5:
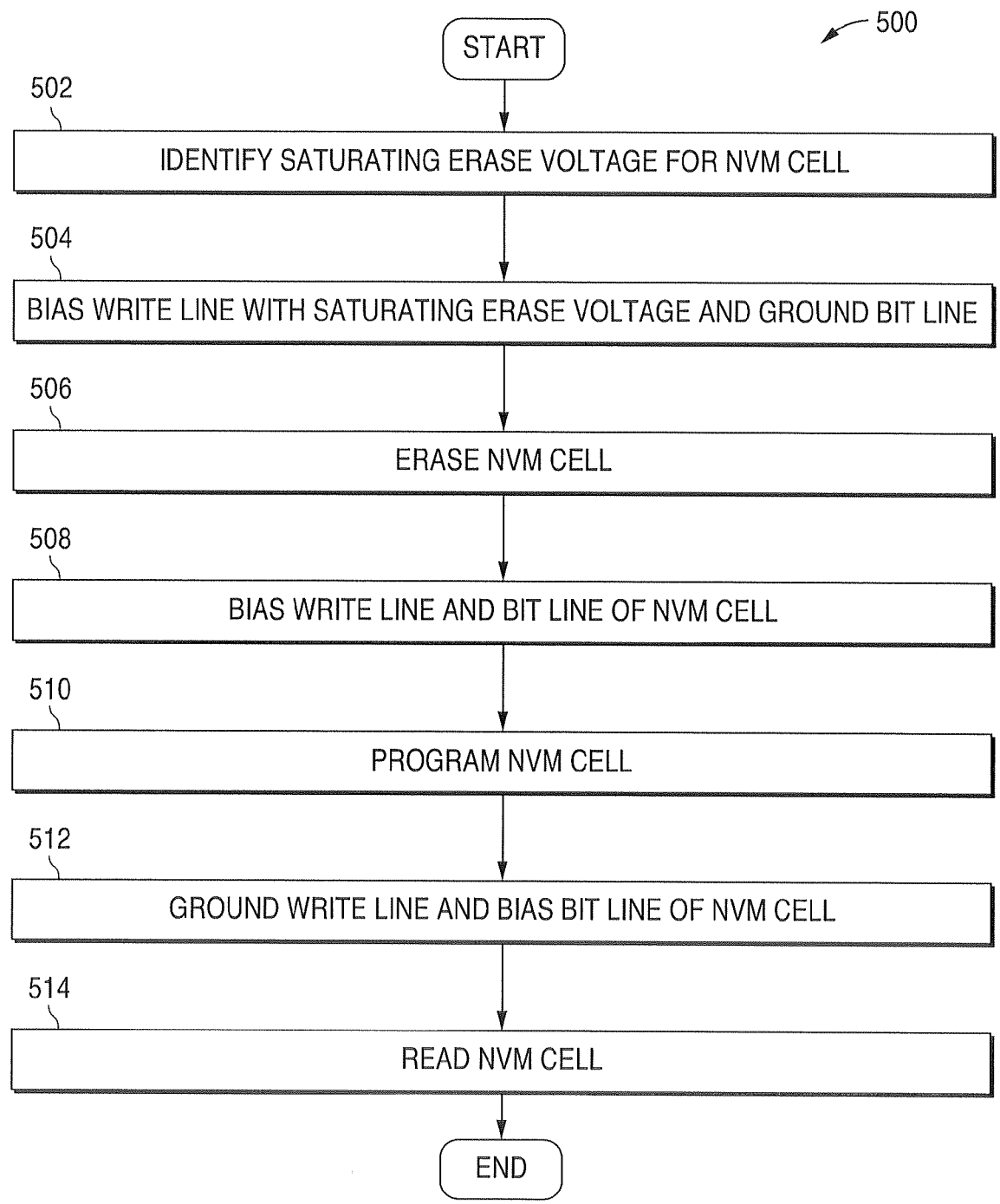
FIG. 5 illustrates an example method for erasing, programming, and reading a non-volatile memory cell according to this disclosure.

FIG. 5 illustrates an example method 500 for erasing, programming, and reading a non-volatile memory cell according to this disclosure. The embodiment of the method 500 shown in FIG. 5 is for illustration only. Other embodiments of the method 500 could be used without departing from the scope of this disclosure.

A saturating erase voltage for a non-volatile memory cell is identified at step 502. This could include, for example, using the various equations identified above to determine the saturating erase voltage for the non-volatile memory cell 100. As particular examples, the saturating erase voltage could be determined before a memory cell is fabricated or during use of the memory cell.

A write line of the memory cell is biased and a bit line of the memory cell is grounded at step 504. This could include, for example, biasing the write line 108 of the memory cell 100 with the identified saturating erase voltage (such as a 12V or 24V signal) and grounding the bit line 110 of the memory cell 100. This erases the memory cell at step 506. This could include, for example, discharging electrons on the floating gate 106 of the memory cell 100 through the transistor 102. This could also include injecting electrons onto the floating gate 106 of the memory cell 100 through the transistor 104. In this way, over-erasure of the memory cell 100 is avoided.

The write line and the bit line of the memory cell are biased at step 508. This could include, for example, biasing the write line 108 of the memory cell 100 with a 6V signal and biasing the bit line 110 of the memory cell 100 with a 5V signal. This programs the memory cell at step 510. This could include, for example, injecting electrons onto the floating gate 106 of the memory cell 100 through the transistor 104.

The write line of the memory cell is grounded and the bit line of the memory cell is biased at step 512. This could include, for example, grounding the write line 108 of the memory cell 100 and biasing the bit line 110 of the memory cell 100 with a 3.3V signal. This allows the memory cell to be read at step 514. This could include, for example, determining whether the current from the memory cell 100 represents a higher level of current or a lower level of current. The different current levels may correspond to different memory states of the memory cell 100. As a particular example, a higher current level could correspond to a memory cell 100 that has been programmed to a "1" state, and a lower current level could correspond to a memory cell 100 that has been not programmed and that remains in the "0" state (or vice versa).

Although FIG. 5 illustrates one example of a method 500 for erasing, programming, and reading a non-volatile memory cell, various changes may be made to FIG. 5. For example, any other suitable voltages could be used to erase, program, and read the memory cell. Also, while shown as a series of steps, various steps in FIG. 5 could overlap, occur in parallel, or occur multiple times. As a particular example, the memory cell 100 could be erased, programmed, and read multiple times and in any suitable order of operations.

It may be advantageous to set forth definitions of certain words and phrases that have been used within this patent document. The term "couple" and its derivatives refer to any direct or indirect communication between two or more components, whether or not those components are in physical contact with one another. The term "program" and its derivatives refer to any operation to store data, whether that operation is referred to as a write operation, a program operation, or other type of operation. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, software, or some combination of at least two of the same. The functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A method comprising:
   applying a first voltage to a first transistor in a memory cell and applying a second voltage to a second transistor in the memory cell during an erase operation, the first transistor having a first gate, the second transistor having a second gate, the first and second gates coupled to form a floating gate; and
   discharging current from the floating gate through the first transistor and injecting current onto the floating gate through the second transistor during the erase operation in response to the first and second voltages to prevent an over-erase condition from forming in the memory cell.

2. The method of claim 1, wherein applying the first voltage comprises applying the first voltage to a source, a body, and a drain of the first transistor.

3. The method of claim 2, wherein applying the second voltage comprises applying the second voltage to a source and a body of the second transistor.

4. The method of claim 3, wherein:
   the first voltage comprises a voltage between 12V and 24V, inclusive;
   the second voltage comprises ground; and
   a drain of the second transistor is grounded.

5. The method of claim 1, further comprising:
   applying a third voltage to the first transistor and a fourth voltage to the second transistor in the memory cell to either program the memory cell or read the memory cell.

6. The method of claim 1, wherein the first voltage is applied to the first transistor for a time from 100 milliseconds up to 3000 milliseconds.

7. The method of claim 1, further comprising:
   determining a value of the first voltage based on a capacitance of the first transistor, a capacitance of the second transistor, a threshold voltage associated with the first and second transistors, and a voltage provided to the second transistor during programming of the memory cell.

8. A memory cell comprising:
   a first transistor having a first gate;
   a second transistor having a second gate, the first and second gates coupled to form a floating gate;
   a first line coupled to the first transistor, the first line configured to deliver a first voltage to the first transistor during an erase operation; and
   a second line coupled to the second transistor, the second line configured to deliver a second voltage to the second transistor during the erase operation;
   wherein the first and second voltages cause electron discharge from the floating gate through the first transistor and electron injection through the second transistor onto the floating gate during the erase operation to prevent an over-erase condition from forming in the memory cell.

9. The memory cell of claim 8, wherein:
   the first voltage is applied to a source, a body, and a drain of the first transistor; and
   a second voltage is applied to a source and a body of the second transistor.

10. The memory cell of claim 9, wherein:
    the first voltage comprises a voltage between 12V and 24V, inclusive;
    the second voltage comprises ground; and
    a drain of the second transistor is grounded during the erase operation.

11. The memory cell of claim 8, wherein the first voltage is applied to the first transistor for a time from 100 milliseconds up to 3000 milliseconds during the erase operation.

12. The memory cell of claim 8, wherein the first and second transistors comprise p-channel metal oxide semiconductor (PMOS) transistors.

13. A memory array comprising a plurality of memory cells, at least one of the memory cells comprising:
    a first transistor having a first gate;
    a second transistor having a second gate, the first and second gates coupled to form a floating gate;
    a first line coupled to the first transistor, the first line configured to deliver a first voltage to the first transistor during an erase operation; and
    a second line coupled to the second transistor, the second line configured to deliver a second voltage to the second transistor during the erase operation;
    wherein the first voltage is sufficiently high during the erase operation to prevent an over-erase condition from forming in the memory cell, wherein the first voltage is sufficiently high to cause electron discharge from the floating gate through the first transistor and electron injection through the second transistor onto the floating gate during the erase operation.

14. The memory array of claim 13, wherein:
the first voltage is applied to a source, a body, and a drain of the first transistor; and
the second voltage is applied to a source and a body of the second transistor.

15. The memory array of claim 14, wherein:
the first voltage comprises a voltage between 12V and 24V, inclusive;
the second voltage comprises ground; and
a drain of the second transistor is grounded during the erase operation.

16. The memory array of claim 13, wherein the first voltage is applied to the first transistor for a time from 100 milliseconds up to 3000 milliseconds during the erase operation.

17. The memory array of claim 13, wherein the first and second transistors comprise p-channel metal oxide semiconductor (PMOS) transistors.

18. The memory array of claim 13, further comprising:
a controller coupled to the first and second lines, the controller configured to provide the first and second voltages.

19. The memory array of claim 18, wherein the controller is further configured to:
bias the first line with a first program voltage and bias the second line with a second program voltage to program the associated memory cell; and
bias the first line with a read voltage and ground the second line to read the associated memory cell.

20. The memory array of claim 13, wherein the first voltage has a value greater than a value that would allow the over-erase condition to form in the memory cell.

* * * * *